United States Patent
Sato et al.

(10) Patent No.: US 9,881,808 B2
(45) Date of Patent: Jan. 30, 2018

(54) MASK AND PATTERN FORMING METHOD

(71) Applicant: Toshiba Memory Corporation, Tokyo (JP)

(72) Inventors: Takashi Sato, Kanagawa (JP); Satoshi Tanaka, Kanagawa (JP)

(73) Assignee: Toshiba Memory Corporation, Tokyo (JP)

(*) Notice: Subject to any disclaimer, the term of this patent is extended or adjusted under 35 U.S.C. 154(b) by 9 days.

(21) Appl. No.: 14/998,379

(22) Filed: Dec. 28, 2015

(65) Prior Publication Data

US 2017/0076950 A1  Mar. 16, 2017

(30) Foreign Application Priority Data

Sep. 11, 2015  (JP) .................... 2015-180100

(51) Int. Cl.
- *G03F 1/26* (2012.01)
- *G03F 1/28* (2012.01)
- *G03F 1/50* (2012.01)
- *H01L 21/308* (2006.01)

(52) U.S. Cl.
CPC .............. *H01L 21/308* (2013.01); *G03F 1/50* (2013.01)

(58) Field of Classification Search
None
See application file for complete search history.

(56) References Cited

U.S. PATENT DOCUMENTS

| | | |
|---|---|---|
| 2003/0124759 A1 | 7/2003 | Tsuboi et al. |
| 2004/0259042 A1 | 12/2004 | Fritze et al. |
| 2005/0244724 A1 | 11/2005 | Asano et al. |
| 2006/0210888 A1* | 9/2006 | Taniguchi ............ G03F 1/30 430/5 |
| 2007/0065730 A1 | 3/2007 | Misaka |
| 2007/0065732 A1 | 3/2007 | Lee et al. |
| 2009/0191475 A1 | 7/2009 | Lee et al. |
| 2014/0302679 A1 | 10/2014 | Kakuta et al. |

FOREIGN PATENT DOCUMENTS

| | | |
|---|---|---|
| JP | 7-49411 | 2/1995 |
| JP | 2004-39860 | 2/2004 |
| JP | 2015-22067 | 2/2015 |

* cited by examiner

*Primary Examiner* — Stephen Rosasco
(74) *Attorney, Agent, or Firm* — Finnegan, Henderson, Farabow, Garrett & Dunner L.L.P.

(57) ABSTRACT

According to one embodiment, a mask includes a substrate, first and second pattern portions. The substrate includes a first surface, and the substrate is light transmissive. The first pattern portion includes first optical members. The first optical members are provided on the first surface. A light transmittance of the first optical members is lower than a light transmittance of the substrate. A distance between the adjacent two first optical members is a first distance. The second pattern portion includes second optical members. The second optical members are provided on the first surface. A light transmittance of the second optical members is lower than the light transmittance of the substrate. A distance between the adjacent two second optical members is a second distance. A first phase of a light penetrating the first pattern portion is different from a second phase of a light penetrating the second pattern portion.

20 Claims, 7 Drawing Sheets

MASK AND PATTERN FORMING METHOD

CROSS-REFERENCE TO RELATED APPLICATIONS

This application is based upon and claims the benefit of priority from Japanese Patent Application No. 2015-180100, filed on Sep. 11, 2015; the entire contents of which are incorporated herein by reference.

FIELD

Embodiments described herein relate generally to a mask and a pattern forming method.

BACKGROUND

A mask having a repeated pattern is irradiated with light, and thereby a substrate to be transferred is exposed by light intensity according to an opening ratio and a gray level exposure region (gray region) can be formed on the substrate to be transferred. For the mask used for forming such a gray region, a high accuracy pattern is desired to be formed easily.

DETAILED DESCRIPTION

Figure 1:
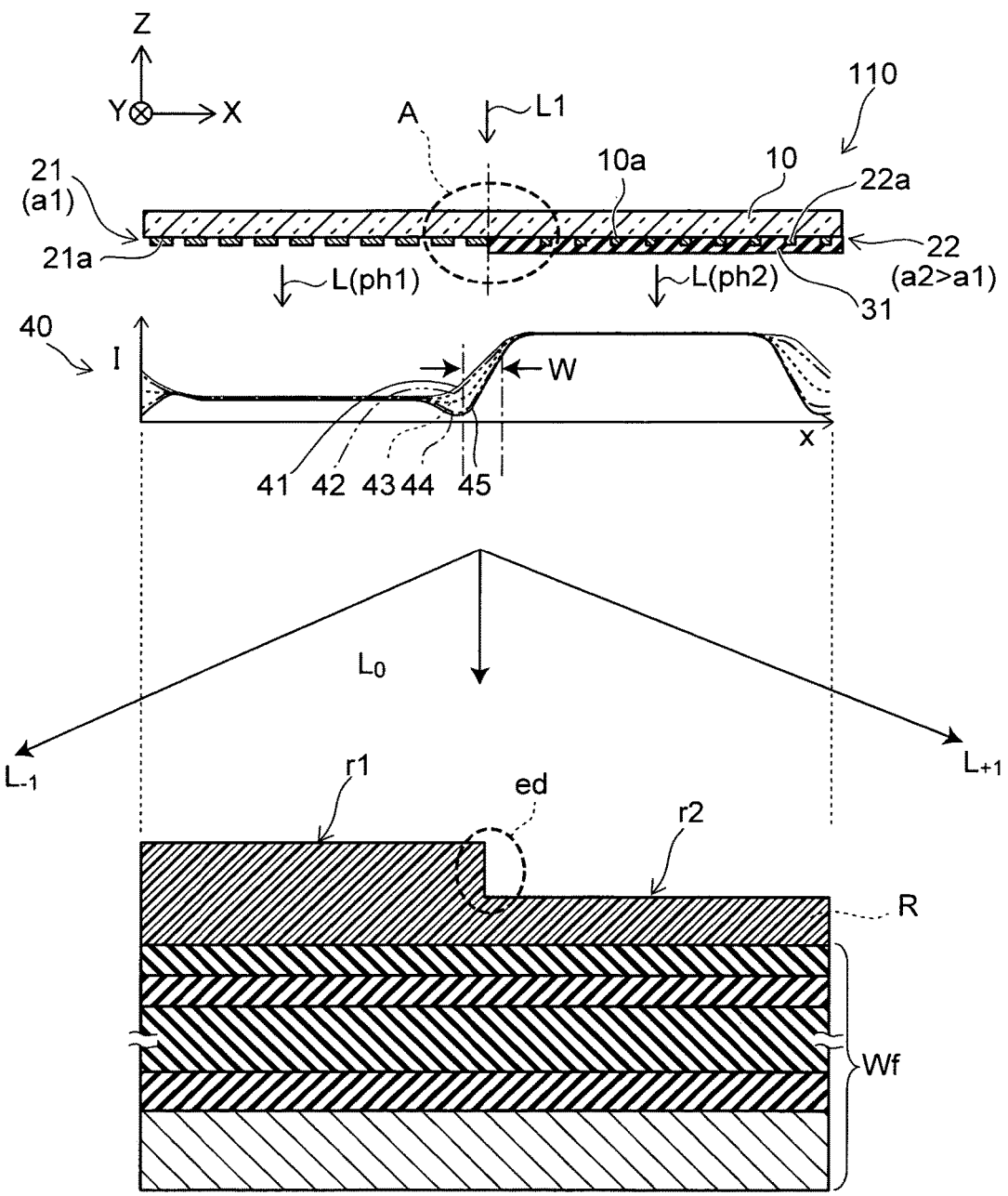
FIG. 1 is a schematic view illustrating a mask and a semiconductor wafer according to a first embodiment.

According to one embodiment, a mask includes a substrate, a first pattern portion and a second pattern portion. The substrate includes a first surface, and the substrate is light transmissive. The first pattern portion includes a plurality of first optical members. The first optical members are provided on the first surface and arranged in a first direction along the first surface. A light transmittance of the first optical members is lower than a light transmittance of the substrate. A distance between the adjacent two first optical members is a first distance. The second pattern portion includes a plurality of second optical members. The second optical members are provided on the first surface and arranged in the first direction. A light transmittance of the second optical members is lower than the light transmittance of the substrate. A distance between the adjacent two second optical members is a second distance different from the first distance. A first phase of a light penetrating the first pattern portion after a first light being incident on the first pattern portion is different from a second phase of a light penetrating the second pattern portion after the first light being incident on the second pattern portion.

According to another embodiment, a pattern forming method is disclosed. The method is based on a mask. The mask includes a substrate, a first pattern portion and a second pattern portion. The substrate includes a first surface, and the substrate is light transmissive. The first pattern portion includes a plurality of first optical members. The first optical members are provided on the first surface and arranged in a first direction along the first surface. A light transmittance of the first optical members is lower than a light transmittance of the substrate. A distance between the adjacent two first optical members is a first distance. The second pattern portion includes a plurality of second optical members. The second optical members are provided on the first surface and arranged in the first direction. A light transmittance of the second optical members is lower than the light transmittance of the substrate. A distance between the adjacent two second optical members is a second distance different from the first distance. The method can dispose the mask and a semiconductor wafer. The method can cause a first light from an illumination optical system to enter the first pattern portion and the second pattern portion. The method can cause a first phase of a light penetrating the first pattern portion to be different from a second phase of a light penetrating the second portion by the mask, and to emit a 0-order diffraction light, a +1-order diffraction light and a −1-order diffraction light of respective optical images of the light of the first phase and the light of the second phase to a projection optical system. The method can cause the 0-order diffraction light to penetrate by the projection optical system and finally form a pattern on the semiconductor wafer by the semiconductor wafer being irradiated with the 0-order diffraction light.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 2A:
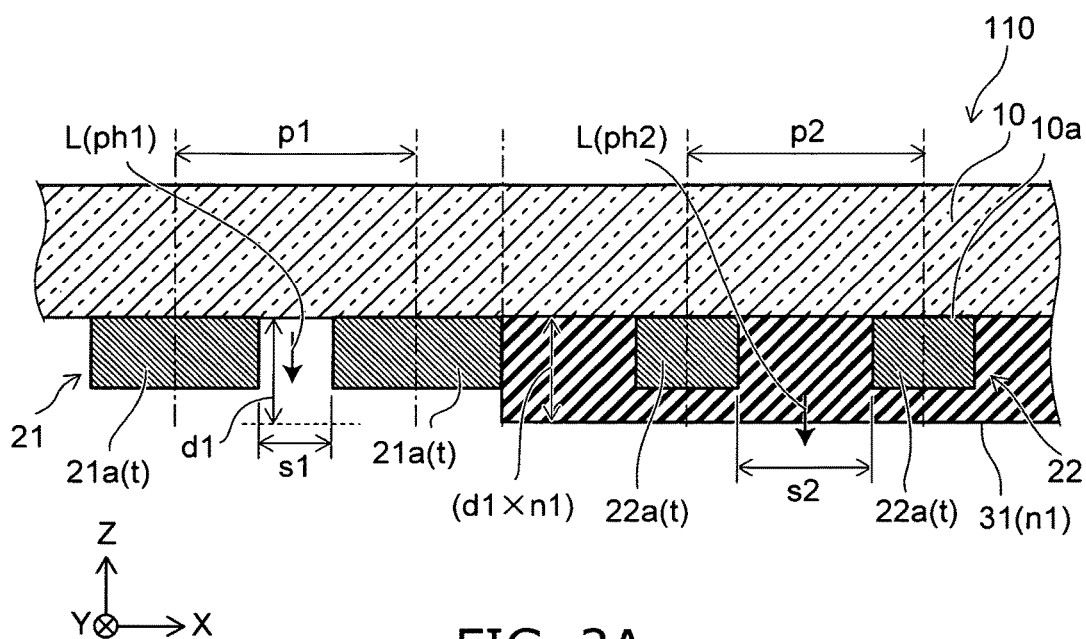
FIG. 2A and FIG. 2B are schematic views illustrating the mask according to the first embodiment.
Figure 2B:
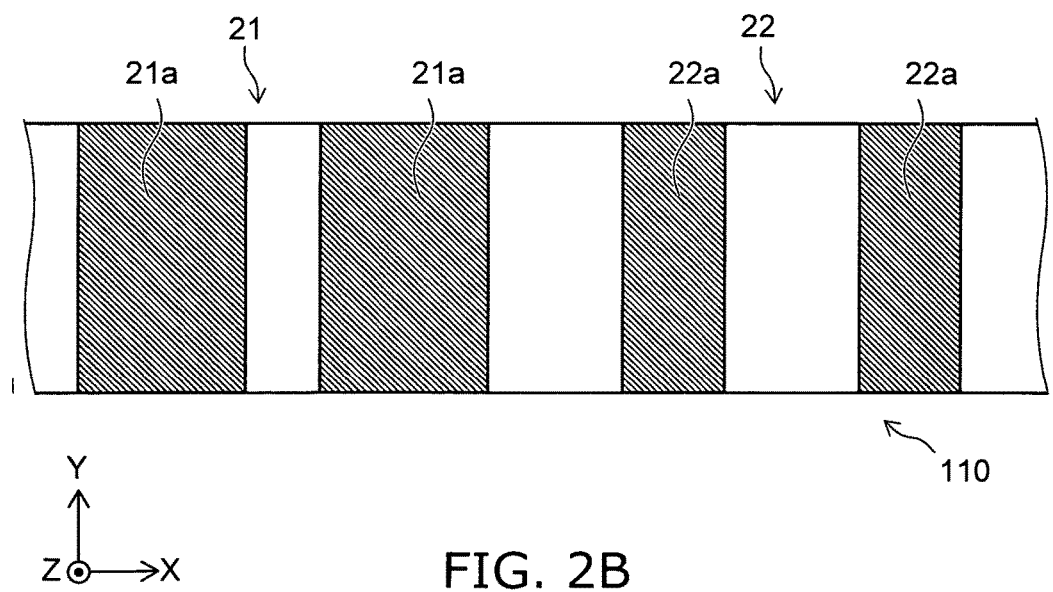

FIG. 1, FIG. 2A and FIG. 2B are schematic views illustrating a mask and a semiconductor wafer according to a first embodiment.

FIG. 1 is a schematic cross-sectional view illustrating a mask and a semiconductor wafer.

FIG. 2A is a schematic partial cross-sectional view of an enlarged portion A in FIG. 1.

FIG. 2B is a schematic partial plan view of an enlarged portion A in FIG. 1.

A mask 110 according to the embodiment includes a substrate 10, a first pattern portion 21, a second pattern portion 22, and a first member 31.

The substrate 10 includes a first surface 10a. The substrate is light transmissive. The substrate 10 includes, for example, quartz or synthetic quartz or the like.

The first pattern portion 21 is provided on the first surface 10a. The first pattern portion 21 includes a plurality of first optical members 21a. The plurality of first optical members 21 are arranged separately in a first direction along the first surface 10a and are light shielding. The first optical members 21a include, for example, chromium (Cr) or the like. A light transmittance of the first optical members 21a is lower than a light transmittance of the substrate 10. The first optical members 21a shield first light L1 with which the mask 110 is irradiated in lithography. The first light L1 is light with which the mask 110 is irradiated. The first light L1 is incident light to the mask 110. A distance between the adjacent two first optical members 21a is a first distance s1. The first light L1 enters respective portions between the plurality of first optical members 21a.

The second pattern portion 22 is provided on the first surface 10a. The second pattern portion 22 is located next to the first pattern portion 21. The second pattern portion 22 includes a plurality of second optical members 22a. The plurality of second optical members 22 are arranged separately in the first direction and are light shielding. The second optical members 22a include, for example, chromium (Cr) or the like. A light transmittance of the second optical members 22a is lower than the light transmittance of the substrate 10. The second optical members 22a shield the first light L1 with which the mask 110 is irradiated in lithography. A distance between the adjacent two second optical members 22a is a second distance s2. The second distance s2 is different from the first distance s1. In this example, the second distance s2 is longer than the first distance s1.

Here, a direction orthogonal to the first surface 10a is taken as an X-axis direction. One direction crossing the Z-axis direction is taken as an X-axis direction. One direction crossing the Z-axis direction and the X-axis direction is taken as a Y-axis direction. The first direction is, for example, the X-axis direction.

The mask 110 functions as, for example, a grating mask forming a stair shaped gray region on the semiconductor wafer Wf.

A resist R is provided on the semiconductor wafer Wf. The semiconductor wafer Wf is, for example, for a 3-dimensional stacked semiconductor memory element. In the 3-dimensional stacked semiconductor memory element, an end portion of the semiconductor wafer Wf is made to be a stair structure and wiring is performed. At this time, the resist R is made to be a stair shaped and the semiconductor wafer Wf is etched at a time. The stair shape of the resist R is formed depending on the mask pattern of the mask 110.

When the first light L1 enters, the mask 110 emits light L according to the mask pattern. The light L is transmitted light that penetrates the mask 110. The light L includes 0-order diffraction light $L_0$, +1-order diffraction light $L_{+1}$, and −1-order diffraction light $L_1$. The mask 110 is patterned so that only 0-order light $L_0$ arrives at the semiconductor wafer Wf. Thereby, a first gray region r1 and a second gray region r2 are formed in the resist R depending on the opening ratio of the mask pattern. That is, the first gray region r1 has a thickness according to the light intensity of the 0-order diffraction light $L_0$ penetrating the first pattern potion 21. The second gray region r2 has a thickness according to the light intensity of the 0-order diffraction light $L_0$ penetrating the second pattern potion 22. The thickness of the gray region decreases with increasing light intensity.

Here, as shown in FIG. 2A, a distance between centers in the X-axis direction of the adjacent two first optical members 21a is taken as a first pattern pitch p1. A distance between centers in the X-axis direction of the adjacent two second optical members 22a is taken as a second pattern pitch p2. In this example, the first pattern pitch p1 is equal to the second pattern pitch p2. Both of the light transmittance of the first optical members 21a and the light transmittance of the second optical members 22a are taken as t. A first normalized pattern interval a1 of the first pattern portion 21 is taken as s1/p1. A second normalized pattern interval a2 of the second pattern portion 22 is taken as s2/p2.

The light intensity $I_{01}$ of the 0-order diffraction light $L_0$ emitted from the first pattern portion 21 can be expressed by the following formula 1.

$$I_{01}=|A_{01}|^2$$

$$A_{01}=a1(1+t)-t \quad (1)$$

The light intensity $I_{02}$ of the 0-order diffraction light $L_0$ emitted from the second pattern portion 22 can be expressed by the following formula 2.

$$I_{02}=|A_{02}|^2$$

$$A_{02}=a2(1+t)-t \quad (2)$$

Here, the respective light intensities $I_{1\pm1}$ of the +1-order diffraction light $L_{+1}$ and the −1-order diffraction light $L_{-1}$ emitted from the first pattern portion 21 are expressed by the following formula 3.

$$I_{1\pm1}=|A_{1\pm1}|^2$$

$$A_{1\pm1}=(1+t)\sin(a1\pi)/\pi \quad (3)$$

The respective light intensities $I_{2\pm1}$ of the +1-order diffraction light $L_{+1}$ and the −1-order diffraction light $L_{-1}$ emitted from the second pattern portion 22 are expressed by the following formula 4.

$$I_{12\pm1}=|A_{1\pm1}|^2$$

$$A_{2\pm1}=(1+t)\sin(a2\pi)/\pi \quad (4)$$

From the formula 1, the light intensity $I_n$ of the 0-order diffraction light $L_0$ emitted from the first pattern portion 21 is determined by the first normalized pattern interval a1, namely, the first distance s1. From the formula 2, the light intensity $I_{02}$ of the 0-order diffraction light $L_0$ emitted from the second pattern portion 22 is determined by the second normalized pattern interval a2, namely, the second distance s2. The second distance s2 is longer than the first distance s1. That is, the light intensity $I_{02}$ is larger than the light intensity $I_n$. Therefore, the thickness of the second gray region r2 results in being thinner than the thickness of the first gray region r1.

In this way, the distances (s1, s2) between the normalized pattern intervals (a1, a2), namely, the distances s1, s2) between the adjacent two optical members (21a, 22a) are changed, and thus the stair shaped gray regions (r1, r2) can be possible to be formed on the semiconductor wafer Wf.

In the embodiment, a first phase ph1 of the light L penetrating the first pattern portion 21 when the first light L1 enters the first pattern portion 21 is different from a second phase ph2 of the light L penetrating the second pattern portion 22 when the first light L1 enters the second pattern portion 22. The first phase ph1 is a phase of the transmitted light (light L) of the first pattern portion 21. The second phase ph2 is a phase of the transmitted light (light L) of the second pattern portion 22.

The second pattern portion 22 includes a first member 31. The first member 31 is light transmissive. At least a portion of the first member 31 is provided between the plurality of second optical members 22a. At least the portion of the first member 31 is provided between the two adjacent second optical members 22a. The first member 31 includes, for example, a silicon oxide such as $SiO_2$. In this example the first member 31 covers the plurality of second optical members 22a. The first member 31 may not cover the plurality of second optical members 22a. The first phase ph1 is caused to be different from the second phase ph2 by providing the first member 31.

A thickness d1 of the first member 31 can be determined based on a phase difference between the first phase ph1 and the second phase ph2. This phase difference is desirable, for example, to be not less than 45 degrees and not more than 180 degrees. The reason will be described based on a graph 40 in FIG. 1.

The graph 40 represents the relationship between a position on the wafer surface and the light intensity when the semiconductor wafer Wf is exposed by using the mask 110. The vertical axis represents the light intensity I and the horizontal axis represents the position x on the wafer surface of the semiconductor wafer Wf.

The mask 110 forms the first gray region r1 and the second gray region r2 on the semiconductor wafer Wf. At this time, at a boundary portion ed of a boundary line between the first gray region r1 and the second gray region r2, unsharpness amount W shown in the graph 40 exists. The unsharpness amount can be approximated by $\lambda/NA$. $\lambda$ represents a wavelength (nanometer: nm) of the first light L1, and NA (Numerical Aperture) represents a numerical aperture of the projection optical system.

When the unsharpness amount is large, the boundary portion ed varies gradually. For this reason, the boundary between the first gray region r1 and the second gray region r2 is unclear. The end portion of the semiconductor wafer Wf does not form the stair shape having clear unevenness of a level difference. For this reason, regions may not be differentiated at the end portion of the semiconductor wafer Wf. Therefore, the unsharpness amount is desired to be small.

The inventors have found that the phase difference of the transmitted light of the mask pattern is effectively given to decrease the unsharpness amount.

The graph 40 shows the simulation results of change of the unsharpness amount when changing the phase difference between the first phase ph1 and the second phase ph2 of the mask 110. The first light L1 is incident on the mask 110 along the Z-axis direction with reduced illumination. The phase difference characteristic 41 shows the case of the phase difference of 0 degree. The phase difference characteristic 42 shows the case of the phase difference of 45 degrees. The phase difference characteristic 43 shows the case of the phase difference of 90 degrees. The phase difference characteristic 44 shows the case of the phase difference of 135 degrees. The phase difference characteristic 45 shows the case of the phase difference of 180 degrees.

In this manner, with increasing phase difference between the first phase ph1 and the second phase ph2, the unsharpness amount becomes small. That is, if the phase difference is not less than 45 degrees and not more than 180 degrees, the unsharpness amount can be small.

Here, the wavelength of the first light L1 is taken as $\lambda$ (nm), a refractive index of the first member 31 is taken as n1, and the phase difference between the first phase ph1 and the second phase ph2 is taken as ph (degree). In the second pattern portion 22, an optical length (optical path length) of the first light L1 traveling through the first member 31 of the thickness d1 (nm) is d1×n1. Assuming a refractive index of vacuum being 1, in the first pattern portion 21, a distance of the first light L1 traveling between the two adjacent first optical members 21a is d1. Therefore, the thickness d1 of the first member 31 can be determined from the following formula 5.

$$d1 = ph \cdot \lambda / \{360(n1-1)\} \quad (5)$$

In the formula 5, when the phase difference is intended to be 180 degrees, ph=180 may be set. When the phase difference is intended to be 135 degrees, ph=135 may be set. When the phase difference is intended to be 90 degrees, ph=90 may be set. When the phase difference is intended to be 45 degrees, ph=45 may be set. In this manner, the thickness d1 of the first member 31 can be determined depending on the desired phase difference. The thickness d1 of the first member 31 is desired, for example, to be not less than 0.8 times and not more than 1.2 times of the value determined by the formula 5.

As described above, according to the embodiment, the unsharoness amount can be decreased and the boundary portion ed between the first gray region r1 and the second gray region r2 can be set to be the stair structure having clear unevenness of the level difference. Thereby, a high accuracy pattern can be formed easily.

Second Embodiment

Figure 3:
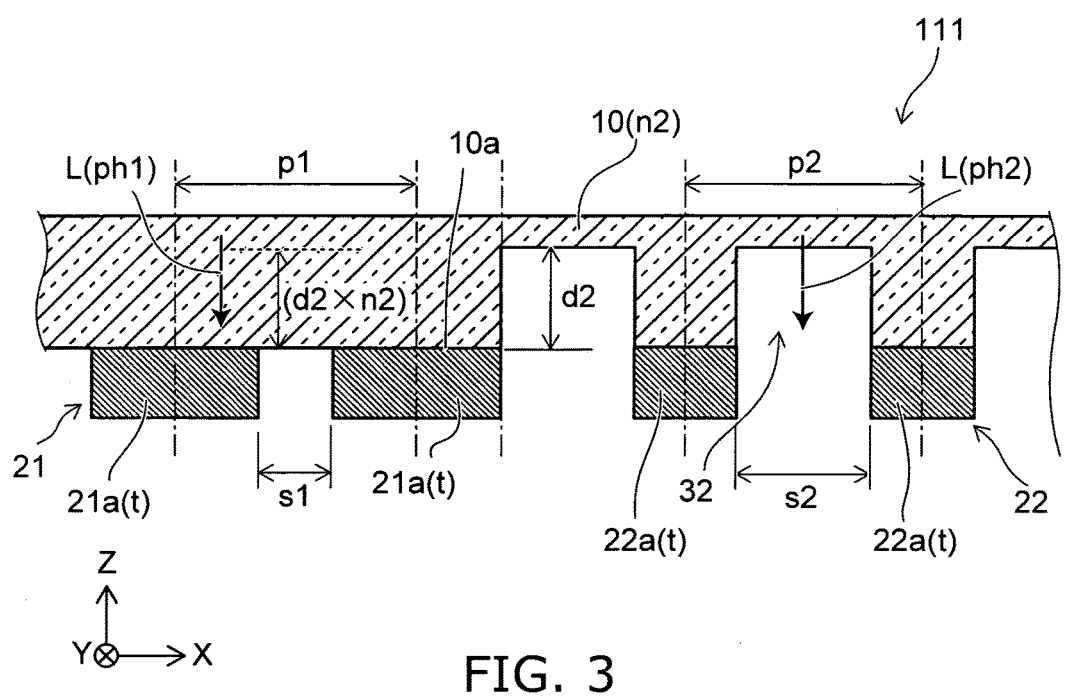
FIG. 3 is a schematic partial cross-sectional view illustrating a mask according to a second embodiment.

FIG. 3 is a schematic partial cross-sectional view illustrating a mask according to a second embodiment.

A mask 111 according to the embodiment is provided with a groove portion in place of the first member 31.

The second pattern portion 22 includes the groove portion 32 provided on the substrate 10. A position of the groove portion 32 in the X-axis direction is between the adjacent two second optical members 22a. The position of the groove portion 32 in the X-axis direction is between positions of the respective two of the plurality of second optical members 22a in the X-axis direction. The groove 32 is formed by recessing the substrate 10 through etching.

A depth d2 of the groove 32 can be determined based on the phase difference between the first phase ph1 and the second phase ph2. This phase difference is, for example, desired to be not less than 45 degrees and not less than 18-degrees as well as the first embodiment.

Here, the wavelength of the first light L1 is taken as A (nm), a refractive index of the substrate 10 is taken as n2, and the phase difference between the first phase ph1 and the second phase ph2 is taken as ph (degree). In the first pattern portion 21, an optical length (optical path length) of the first light L1 traveling through the substrate 10 of the thickness d2 (nm) is d2×n2. Assuming a refractive index of vacuum being 1, in the second pattern portion 22, a distance of the first light L1 traveling the groove portion 32 of the depth d2 (nm) is d2. Therefore, the depth d2 of the groove portion 32 can be determined from the following formula 6.

$$d2 = ph \cdot \lambda / \{360(n2-1)\} \quad (6)$$

In the formula 6, when the phase difference is intended to be 180 degrees, ph=180 may be set. When the phase difference is intended to be 135 degrees, ph=135 may be set. When the phase difference is intended to be 90 degrees, ph=90 may be set. When the phase difference is intended to be 45 degrees, ph=45 may be set. In this manner, the depth d2 of the groove portion 32 can be determined depending on the desired phase difference. The depth d2 of the groove portion 32 is desired, for example, to be not less than 0.8 times and not more than 1.2 times of the value determined by the formula 6.

As described above, according to the embodiment, the unsharoness amount can be decreased and the boundary portion ed between the first gray region r1 and the second gray region r2 can be set to be the stair structure having clear unevenness of the level difference. Thereby, a high accuracy pattern can e formed easily.

Figure 4:
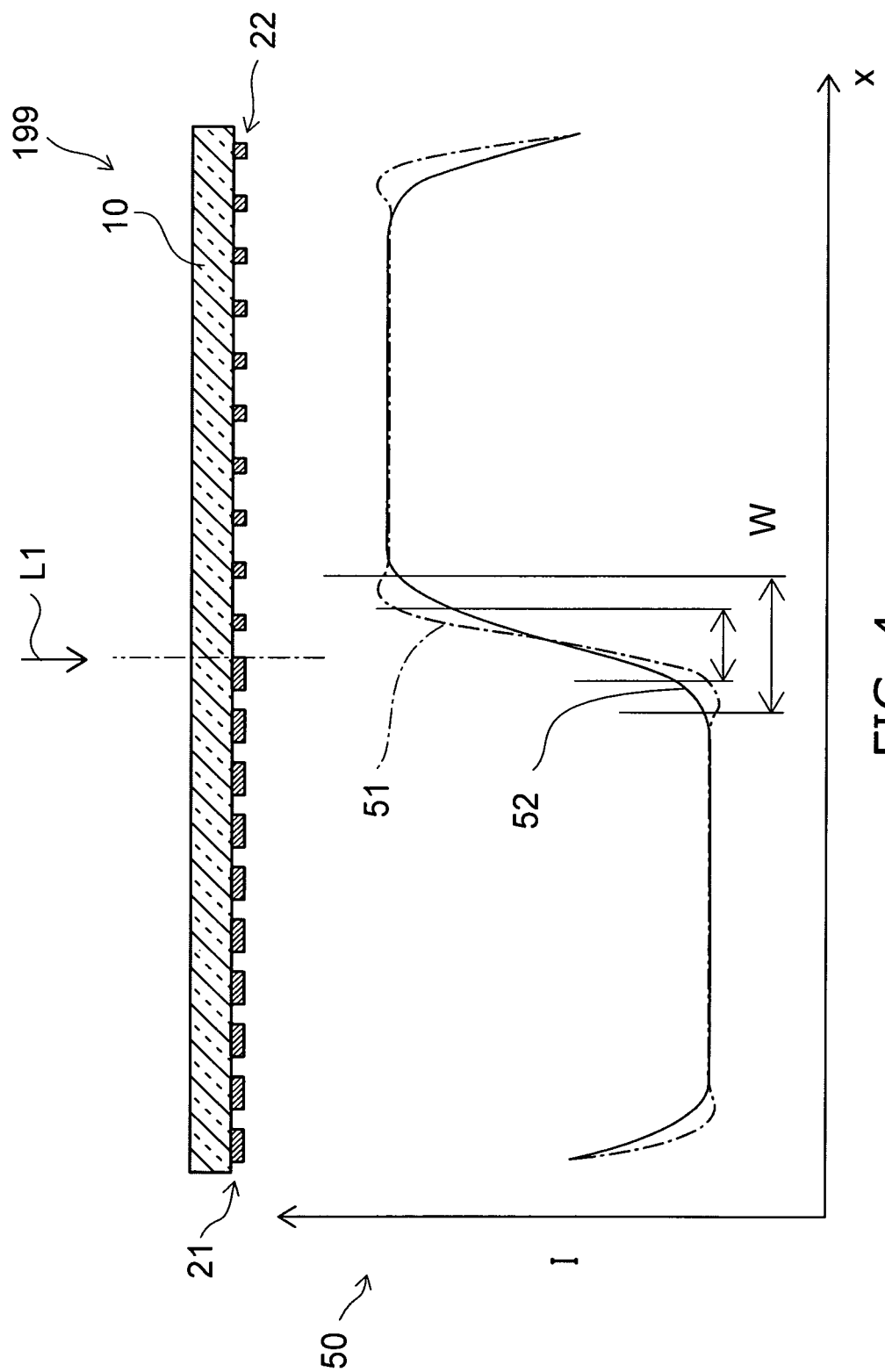
FIG. 4 is a schematic cross-sectional view illustrating a mask according to a reference example.

FIG. 4 is a schematic cross-sectional view illustrating a mask according to a reference example.

A mask 199 according to the reference example includes the substrate 10, the first pattern portion 21, and the second pattern portion 22.

The mask 199 is not provided with the first member 31 and the groove portion 32. That is, the first phase ph1 of the transmitted light of the first pattern portion 21 is in the same phase as the second phase ph2 of the transmitted light of the first pattern portion 22.

The graph 50 represents the relationship between a position on the wafer surface and the light intensity when the semiconductor wafer is exposed by using the mask 199. The vertical axis represents the light intensity I and the horizontal axis represents the position x on the wafer surface of the semiconductor wafer.

The mask 199 forms the first gray region r1 and the second gray region r2 on the semiconductor wafer. At this time, at a boundary portion ed of a boundary line between the first gray region r1 and the second gray region r2, unsharpness amount W shown in the graph 50 exists. The unsharpness amount can be approximated by λ/NA. λ represents a wavelength (nanometer: nm) of the first light L1, and NA represents a numerical aperture of the projection optical system.

The graph 50 shows the simulation results of change of the unsharpness amount when changing the numerical aperture NA of the projection optical system. The first light L1 is incident on the mask 199 along the Z-axis direction with reduced illumination. The numerical aperture characteristic 51 shows the case of the numerical aperture NA of 0.630. The numerical aperture characteristic 52 shows the case of the numerical aperture NA of 0.315. The unsharpness amount W of the numerical aperture characteristic 51 is smaller than the unsharpness amount W of the numerical aperture characteristic 52. That is, it is efficient to make the numerical aperture NA of the projection optical system large in order to make the unsharpness amount W small.

However, the numerical aperture of the projection optical system is determined by specification of the exposure device. Because of this, if the specification of the exposure device is once determined, its change is difficult and pattern cannot be easily formed.

On the other hand, according to the embodiment, it is only necessary to process the mask and give the phase difference corresponding to the respective regions of the semiconductor wafer. Thereby, without depending on the specification of the exposure device, a high accuracy pattern can be formed easily.

Third Embodiment

An exposure device used for a pattern forming method according to a third embodiment will be described.

In a lithography process in manufacturing a semiconductor device, when a high resolution is needed, for example, deep ultra violet (DUV) light using ArF excimer laser of a wavelength of 193 nm as a light source is used for an illumination light source. For forming a fine pattern, a mask (reticle) having a size of four times of the pattern actually formed and the exposure device constituted from the reduction projection optical system are used.

Figure 5:
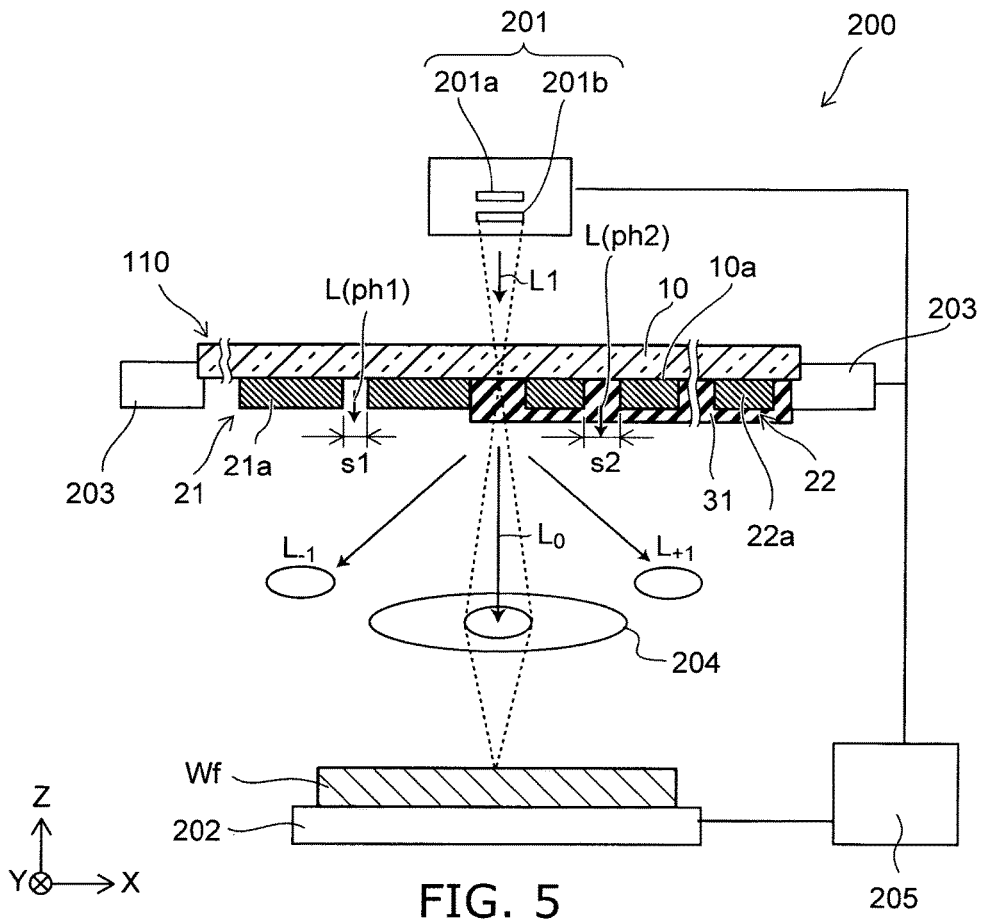
FIG. 5 is a schematic view illustrating an exposure device according to a third embodiment.

FIG. 5 is a schematic view illustrating the exposure device according to the third embodiment.

As shown in FIG. 5, an exposure device 200 includes an illumination optical system 201, a stage 202, a mask holder 30, a projection optical system 204, and a controller 205.

The semiconductor wafer Wf is placed on the stage 202. The semiconductor wafer Wf is adsorbed and held on the stage 202, for example, by vacuum adsorption. The stage 202 is movable along the Z-axis direction and an X-Y plane surface.

The mask holder 203 holds the mask 110. Thereby, the mask 110 and the semiconductor wafer Wf are displaced separately each other. The mask holder 203 is movable along the Z-axis direction and the X-Y plane surface. Thereby, the relative position relationship between the semiconductor wafer Wf and the mask 110 is adjustable.

The mask 110 includes the substrate 10, the first pattern portion 21, and the second pattern portion 22. The substrate 10 transmits the first light L1 having a prescribed wavelength. The first pattern portion 21 includes the plurality of first optical members 21a. The second pattern portion 22 includes the plurality of second optical members 21a.

The substrate includes, for example, quartz and synthetic quartz or the like. The plurality of first optical members 21a and the plurality of second optical members 22a include, for example, chromium (Cr). The plurality of first optical members 21a and the plurality of second optical members 22a shield the first light L1 with which the mask 110 is irradiated in lithography.

A periodic pattern of line and space is formed on each of the plurality of first optical members 21a and the plurality of second optical members 22a, however the periodic pattern may be island-shaped.

The first distance s1 between the adjacent two first optical members 21a is different from the second distance s2 between the adjacent two second optical members 21a. In this example, the second distance s2 is longer than the first distance s1.

The first phase ph1 of the light L penetrating respective portions between the plurality of first optical members 21a is different from the second phase ph2 of the light L penetrating respective portion's between the plurality of second optical members 22a. The first phase ph1 is a phase of the transmitted light of the first pattern portion 21. The second phase ph2 is a phase of the transmitted light of the second pattern portion 22.

At least a portion of the first member 31 is provided between the plurality of second optical members 22a. The first member 31 includes, for example, a silicon oxide such as $SiO_2$. In this example the first member 31 covers the plurality of second optical members 22a. The first member 31 may not cover the plurality of second optical members 22a. The first phase ph1 is caused to be different from the second phase ph2 by providing the first member 31. The groove portion 32 shown in FIG. 3 may be provided in place of the first member 31.

The illumination optical system 201 includes a light source 201a and an optical unit 201b. For example, one of ArF excimer laser and KrF excimer laser is used for the light source 201a. The wavelength of illumination light emitted from the light source 201a is, for example, not less than 190 nm and not less than 250 nm. A high pressure mercury lamp and other laser light sources may be used for the light source 201a.

The optical unit 201b includes at least one of a lens, a mirror, a diaphragm, a polarizer, an optical diffusion plate, and an optical filter. For example, at least one of fly-eye lens, the optical diffusion plate, and an oscillation mirror can be used for the optical unit 201.

The fly-eye lens is an optical member having a plurality of lenses arranged in a plain surface.

The optical diffusion plate is an optical member diffusing the incident light in multiple directions. That is, a portion of the incident light to the optical diffusion plate travels in one direction, and another portion of the incident light travels in another direction different from the one direction.

The oscillation mirror is a reflection member capable of switching directions in which the incident light is reflected. That is, the oscillation mirror has a first state in which the incident light is reflected in one direction, and a second state in which the incident light is reflected in another direction different from the one direction. For example, the light source is converted from a point source to a surface light source and luminance unevenness of the light source can be suppressed by using the optical member such as a fly-eye lens, an optical diffusion plate and an oscillation mirror. For example, the numerical aperture of the illumination optical system can be adjusted.

The illumination optical system 201 irradiates the first light L1 emitted from the light source 201a to the mask 110 via the optical unit 201b.

The projection optical system 204 is provided between the mask 110 and the semiconductor wafer Wf. The projection optical system 204 includes, for example, a projection lens.

The projection optical system 204 selectively transmits only 0-order diffraction light $L_0$ out of the 0-order diffraction light $L_0$, the +1-order diffraction light $L_{+1}$, and the −1-order diffraction light $L_{-1}$.

Figure 6:
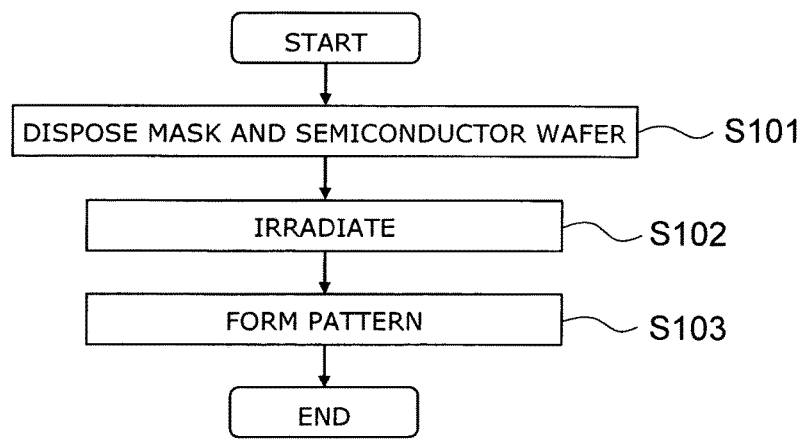
FIG. 6 is a flow chart illustrating a pattern forming method according to the third embodiment.

FIG. 6 is a flow chart illustrating a pattern forming method according to the third embodiment.

The pattern forming method according to the embodiment includes a step S101 to a step S103.

In the step S101, the mask 110 according to the embodiment and the semiconductor wafer Wf are disposed. In the step S102, the semiconductor wafer Wf is irradiated with the light L penetrating the mask 110.

That is, in the step S102, the first light L1 from the illumination optical system 201 is incident on the first pattern portion 21 and the second pattern portion 22 of the mask 110.

The first phase ph1 of the light L penetrating the first pattern portion 21 is differentiated from the second phase ph2 of the light L penetrating the second pattern portion 22 by the mask 110, and the 0-order diffraction light $L_0$, the +1-order diffraction light $L_{+1}$ and the −1-order diffraction light $L_{-1}$ of respective optical images of the light L in the first phase ph1 and the light L in the second phase ph2 are emitted to the projection optical system 204.

The only 0-order diffraction light $L_0$ is selectively transmitted by the projection optical system 204.

The semiconductor wafer Wf is irradiated with the 0-order diffraction light $L_0$ transmitted by the projection optical system 204.

In the step S103, the patter is formed on the semiconductor wafer Wf depending on the region irradiated with the 0-order diffraction light $L_0$. The pattern forming method according to the embodiment relates to a lithography process like this.

Here, optical conditions for forming the gray region on the semiconductor wafer Wf, namely, conditions to the projection optical system 204 and the illumination optical system 201 so as to cause the +1-order diffraction light $L_{+1}$ and the −1-order diffraction light $L_{-1}$ not to contribute to imaging will be described.

Figure 7:
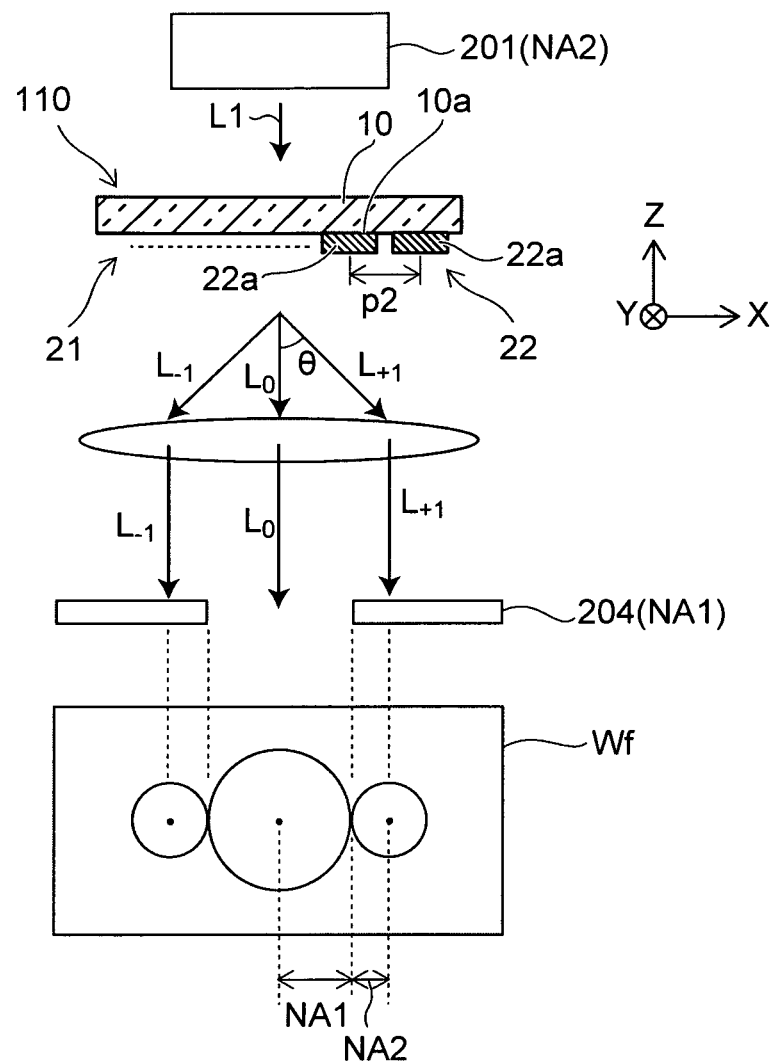
FIG. 7 is a schematic view illustrating an illumination optical system and a projection optical system according to the third embodiment.

FIG. 7 is a schematic view illustrating the illumination optical system and the projection optical system according to the third embodiment.

FIG. 7 show an example of an angle between the first light L1 and the first surface 10a being 90 degrees. For convenience to see the drawing, the first member 31 (or groove portion 32) and the first optical member 21a of the first pattern portion 21 are not shown.

The conditions to the projection optical system 204 and the illumination optical system 201 so as to cause the +1-order diffraction light $L_{+1}$ and the −1-order diffraction light $L_1$ not to contribute imaging are that a distance between the centers of the optical axes of the 1-order diffraction light $L_{+1}$, is larger than a sum of the numerical aperture NA1 of the projection optical system 201 and the numerical aperture NA2 of the illumination optical system 201. That is, the following conditions are satisfied.

$$NA1 + NA2 < \sin\theta$$

$$\sin\theta = \lambda/p2 \quad (7)$$

In the formula (7), p2 indicates a second pattern pitch (nm) of the second optical members 22a. The second pattern pitch p2 is a distance between the centers in the X-axis direction of the adjacent two second optical members 22a. λ indicates a wavelength (nm) of the first light L1. NA1 indicates the numerical aperture of the projection optical system 204. NA2 indicates the numerical number of the illumination optical system 201.

From the formula (7), the following formula (8) is derived.

$$P2 < \lambda/[\{1+(NA2/NA1)\}NA1] \quad (8)$$

If a ratio of the numerical aperture NA2 to the numerical aperture NA1 is taken as a1 (namely, NA2/NA1), the following formula (9) is obtained.

$$P2 < \lambda/\{(1+\sigma1)NA1\} \quad (9)$$

The second pattern pitch p2 of the second optical members 22a is determined so as to satisfy the formula (8), the formula (9). Similarly, the first pattern pitch p1 of the first optical members 21a may be determined. The first pattern pitch p1 is a distance between the centers in the X-axis-direction of the adjacent two first optical members 21a. Thereby, the +1-order diffraction light $L_{+1}$ and the −1-order diffraction light $L_1$ are caused not to be imaged, and the semiconductor wafer Wf can be irradiated with only the 0-order diffraction light $L_0$. The gray region can be formed on the semiconductor wafer Wf.

In the above embodiment, the case of illuminating perpendicularly to the mask 110 has been illustratively described. However, in the mask 110, if the phase difference is given to only one side of one of the first pattern portion 21 and the second pattern portion 22, the pattern position may be shifted laterally depending on the focus position. In order to avoid this, as described below, illumination of the illumination optical system 201 is desired to be, for example, dipole illumination.

Fourth Embodiment

Figure 8:
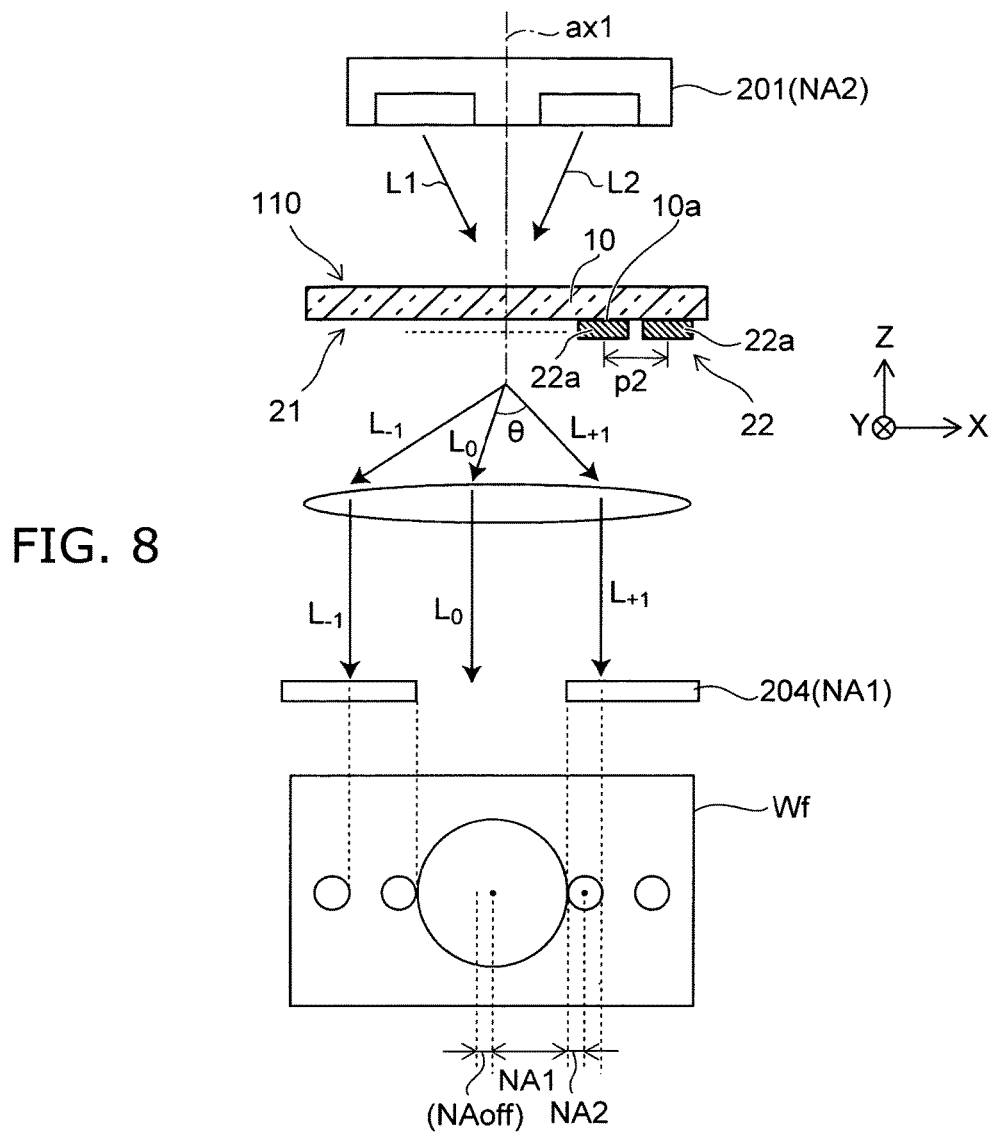
FIG. 8 is a schematic view illustrating an illumination optical system and a projection optical system according to a fourth embodiment.

FIG. 8 is a schematic view illustrating an illumination optical system and a projection optical system according to a fourth embodiment.

FIG. 8 shows an example of the first light L1 being slanted to the first surface 10a. Furthermore, FIG. 8 shows the case where the second light L2 symmetric to the first light L1 around a first axis ax1 perpendicular to the first surface 10a is incident on the first pattern portion 21 and the second pattern portion 22. For convenience to see the drawing, the first member 31 (or groove portion 32) and the first optical member 21a of the first pattern portion 21 are not shown.

The illumination optical system 201 lets the first light L1 slanted to the first axis ax1 perpendicular to the first surface 10a and the second light L2 symmetric to the first light L1 around the first axis ax1 be incident on the mask 110. The illumination optical system 201 is, for example, the dipole illumination. The first light L1 and the second light L2 are incident at a slant on the mask 110. In this example, incidence is performed in two directions, however a light source shape is made, for example, circular or elliptical and incidence may be performed in multi directions to avoid the center.

Here, in the case of using the dipole illumination, the optical conditions for forming the gray region on the semiconductor wafer Wf, namely, the conditions to the projection optical system 204 and the illumination optical system 201 so as to cause the +1-order diffraction light $L_1$ and the −1-order diffraction light $L_{-1}$ not to contribute to imaging will be described.

The conditions to the projection optical system 204 and the illumination optical system 201 so as to cause the +1-order diffraction light $L_{+1}$ and the −1-order diffraction light $L_1$ not to contribute imaging are that a distance between the centers of the optical axes of the 1-order diffraction light $L_{+1}$, $L_{-1}$ is larger than a sum of the numerical aperture NA1 of the projection optical system 201, the numerical aperture NA2 of the illumination optical system 201 and offset $NA_{off}$ of the numerical aperture of the illumination optical system 201. The offset $NA_{off}$ is an amount which the shift amount of the center position of the illumination light soured from the optical axis is converted to NA. That is, the following conditions are satisfied.

$$NA1+NA2+NA_{off}<\sin\theta$$

$$\sin\theta=\lambda/p2 \quad (10)$$

In the formula (10), p2 represents the second patter pitch of the second optical members 22a. The second pattern pitch p2 is the distance between the centers in the X-axis direction of the second optical members 22a. λ represents the wavelength (nm) of the first light L1 and the second light L2. NA1 represents the numerical aperture of the projection optical system 204. NA2 represents the numerical aperture of the illumination optical system 201. $NA_{off}$ represents offset of the numerical aperture of the illumination optical system 201.

The following formula (11) is derived from the formula (10).

$$p2<\lambda/[\{1+(NA2/NA1)+(NA_{off}/NA1)\}NA1] \quad (11)$$

If a ratio of the numerical aperture NA2 to the numerical aperture NA1 is taken as σ1 (namely, NA2/NA1), and a ratio of the offset $N_{off}$ to the numerical aperture NA1 is taken as $\sigma_{off}(N_{off}/NA1)$, the following formula 12 is obtained.

$$p2<\lambda/\{(1+\sigma1+\sigma_{off})NA1\} \quad (12)$$

The second pattern pitch p2 is determined so as to satisfy the formula (11), the formula (12). Similarly, the first pattern pitch p1 of the first optical members 21a may be determined. The first pattern pitch p1 is the distance between the centers in the X-axis direction of the adjacent two first optical members 21a. Thereby, the +1-order diffraction light $L_{+1}$ and the −1-order diffraction light $L_1$ are caused not to be imaged, and the semiconductor wafer Wf can be irradiated with only the 0-order diffraction light $L_0$. The gray region can be formed on the semiconductor wafer Wf.

In this manner, according to the embodiment, if the illumination is the dipole illumination, the right-and-left light intensity can be generally uniform on the imaging surface when the focus position is shifted. Thereby, even if the focus position is shifted, the pattern position can be suppressed from being shifted.

Figure 9:
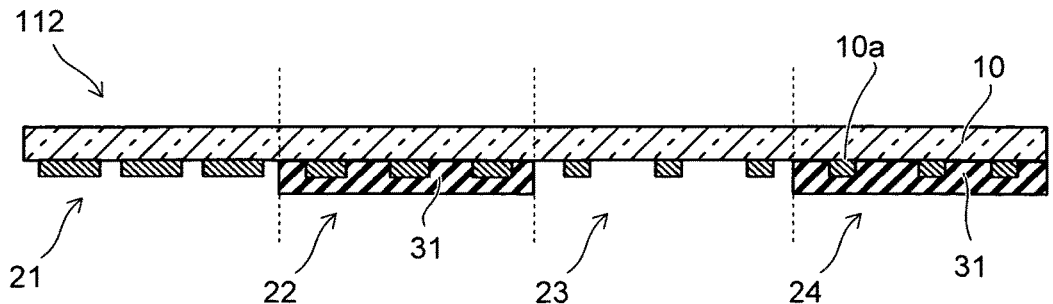
FIG. 9 is a schematic cross-sectional view illustrating a mask according to a fifth embodiment.

FIG. 9 is a schematic cross-sectional view illustrating a mask according to a fifth embodiment.

A mask 112 includes the substrate 10, the first pattern portion 21, the second pattern portion 22, a third, pattern portion 23, and a fourth pattern portion. Each of the third pattern portion and the fourth pattern portion is periodically provided with a plurality of optical members being light shielding.

In the first to fourth embodiments, the mask including the first pattern portion 21 and the second pattern portion 22 is illustratively described, however the number of pattern portions may be 3 or more. In this case, the first member 31 or the groove 32 may be provided in every other one of pattern portions. As shown in FIG. 9, in the case of four pattern portions included, for example, the first member 31 is provided in the second pattern portion 22 located at the second position from the left and the fourth pattern portion 24 located at the fourth position from the left. The groove 32 may be provided in each of the second pattern portion 22 and the fourth pattern portion 24 in place of the first member 31.

In a portion where light amount is intended to be changed, a width of the pattern changes well without change of the pattern pitch. The pattern pitch is, for example, the distance between the centers of the adjacent two first optical members 21a in the X-axis direction. The pattern pitch is, for example, the distance between the centers of the adjacent two second optical members 22a in the X-axis direction. The pattern position can be suppressed from being shifted by not changing the pattern pitch.

According to the embodiments, a mask capable of forming a high accuracy pattern easily and a pattern forming method can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components such as substrates, first pattern portions, second pattern portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all masks and pattern forming methods practicable by an appropriate design modification by one skilled in the art based on the masks and the pattern forming methods described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A mask comprising:
a substrate including a first surface, the substrate being light transmissive;
a first pattern portion including a plurality of first optical members provided on the first surface and arranged periodically in a first direction along the first surface, a light transmittance of the first optical members being lower than a light transmittance of the substrate, a distance between the adjacent two first optical members being a first distance; and
a second pattern portion including a plurality of second optical members provided on the first surface and arranged periodically in the first direction, a light transmittance of the second optical members being lower than the light transmittance of the substrate, a distance between the adjacent two second optical members being a second distance different from the first distance, the second pattern portion including a first member, the first member being light transmissive, and at least a portion of the first member being provided between the second optical members.

2. The mask according to claim 1, wherein
when a thickness of the first member is taken as d1 (nanometer), a refractive index of the first member is taken as n1, a wavelength of the first light is taken as $\lambda$ (nanometer), and a phase difference between a first phase of a light penetrating the first pattern portion after a first light being incident on the first pattern portion and a second phase of a light penetrating the second pattern portion after the first light being incident on the second pattern portion is taken as ph (degree), the d1 is not less than 0.8 times and not more than 1.2 times of $ph \cdot \lambda / \{360(n1-1)\}$.

3. The mask according to claim 2 wherein
the phase difference is not less than 45 degrees and not more than 180 degrees.

4. The mask according to claim 1 wherein
the first member includes a silicon oxide.

5. The mask according to claim 1 wherein
when an angle between the first light and the first surface is 90 degrees,
a distance between centers of the adjacent two second optical members in the first direction is p2 (nanometer),
a wavelength of the first light is $\lambda$ (nanometer),
a numerical number of a projection optical system is NA1, and a numerical aperture of an illumination optical system is NA2,
the p2 is smaller than $\lambda / [\{1+(NA2/NA1)\}NA1]$.

6. The mask according to claim 1 wherein
when the first light is slanted to the first surface,
a second light symmetric to the first light around a first axis perpendicular to the first surface is incident to the first pattern portion and the second pattern portion,
a distance between centers of the adjacent two second optical members in the first direction is p2 (nanometer),
a wavelength of the first light and the second light is $\lambda$ (nanometer),
a numerical number of a projection optical system is NA1, a numerical aperture of an illumination optical system is NA2, and an offset of the numerical aperture of the illumination optical system is $NA_{off}$,
the p2 is smaller than $\lambda / [\{1+(NA2/NA1)+(NA_{off}/NA1)\}NA1]$.

7. The mask according to claim 1 wherein
a first ratio of the first distance to a third distance between centers of the adjacent two first optical members in the first direction is different from a second ratio of the second distance to a fourth distance between centers of the adjacent two second optical members in the first direction.

8. The mask according to claim 7 wherein
the third distance is equal to the fourth distance.

9. A mask comprising:
a substrate including a first surface, the substrate being light transmissive;
a first pattern portion including a plurality of first optical members provided on the first surface and arranged periodically in a first direction along the first surface, a light transmittance of the first optical members being lower than a light transmittance of the substrate, a distance between the adjacent two first optical members being a first distance; and
a second pattern portion including a plurality of second optical members provided on the first surface and arranged periodically in the first direction, a light transmittance of the second optical members being lower than the light transmittance of the substrate, a distance between the adjacent two second optical members being a second distance different from the first distance, the second pattern portion including a groove portion provided on the substrate, and a position of the groove portion in the first direction being between the adjacent two second optical members.

10. The mask according to claim 9, wherein
when a depth of the groove portion is taken as d2 (nanometer), a refractive index of the substrate is taken as n2, a wavelength of the first light is taken as $\lambda$ (nanometer), and a phase difference between the first phase and the second phase is taken as ph (degree), the d2 is not less than 0.8 times and not more than 1.2 times of $ph \cdot \lambda / \{360(n2-1)\}$.

11. The mask according to claim 10 wherein
the phase difference is not less than 45 degrees and not more than 180 degrees.

12. The mask according to claim 9 wherein
a first ratio of the first distance to a third distance between centers of the adjacent two first optical members in the first direction is different from a second ratio of the second distance to a fourth distance between centers of the adjacent two second optical members in the first direction.

13. The mask according to claim 12 wherein
the third distance is equal to the fourth distance.

14. A pattern forming method, comprising:
the method being based on a mask including:
a substrate including a first surface, the substrate being light transmissive;

a first pattern portion including a plurality of first optical members provided on the first surface and arranged periodically in a first direction along the first surface, a light transmittance of the first optical members being lower than a light transmittance of the substrate, a distance between the adjacent two first optical members being a first distance; and a second pattern portion including a plurality of second optical members provided on the first surface and arranged periodically in the first direction, a light transmittance of the second optical members being lower than the light transmittance of the substrate, a distance between the adjacent two second optical members being a second distance different from the first distance, disposing the mask and a semiconductor wafer;

causing a first light from an illumination optical system to enter the first pattern portion and the second pattern portion;

causing a first phase of a light penetrating the first pattern portion to be different from a second phase of a light penetrating the second portion by the mask, and emitting a 0-order diffraction light, a +1-order diffraction light and a −1-order diffraction light of respective optical images of the light of the first phase and the light of the second phase to a projection optical system;

causing the 0-order diffraction light to penetrate by the projection optical system; and forming a pattern on the semiconductor wafer by the semiconductor wafer being irradiated with the 0-order diffraction light.

15. The method according to claim 14, wherein
the second pattern portion includes a first member, the first member being light transmissive, and
at least a portion of the first member being provided between the second optical members.

16. The method according to claim 15, wherein
when a thickness of the first member is taken as d1 (nanometer), a refractive index of the first member is taken as n1, a wavelength of the first light is taken as λ (nanometer), and a phase difference between the first phase and the second phase is taken as ph (degree), the d1 is not less than 0.8 times and not more than 1.2 times of ph·λ/{360(n1−1)}.

17. The method according to claim 14, wherein
the second pattern portion includes a groove portion provided on the substrate, and
a position of the groove portion in the first direction is between the adjacent two second optical members.

18. The method according to claim 17, wherein
when a depth of the groove portion is taken as d2 (nanometer), a refractive index of the substrate is taken as n2, a wavelength of the first light is taken as λ (nanometer), and a phase difference between the first phase and the second phase is taken as ph (degree), the d2 is not less than 0.8 times and not more than 1.2 times of ph·λ/{360(n2−1)}.

19. The method according to claim 14, wherein
when an angle between the first light and the first surface is 90 degrees,
a distance between centers of the adjacent two second optical members in the first direction is p2 (nanometer),
a wavelength of the first light is λ (nanometer),
a numerical number of a projection optical system is NA1, and a numerical aperture of an illumination optical system is NA2,
the p2 is smaller than λ/[{1+(NA2/NA1)}NA1].

20. The method according to claim 14, wherein
when the first light is slanted to the first surface,
a second light symmetric to the first light around a first axis perpendicular to the first surface is incident to the first pattern portion and the second pattern portion,
a distance between centers of the adjacent two second optical members in the first direction is p2 (nanometer),
a wavelength of the first light and the second light is λ (nanometer),
a numerical number of a projection optical system is NA1, a numerical aperture of an illumination optical system is NA2, and an offset of the numerical aperture of the illumination optical system is $NA_{off}$,
the p2 is smaller than λ/[{1+(NA2/NA1)+($NA_{off}$/NA1)}NA1].

* * * * *